(12) United States Patent
Dermark

(10) Patent No.: US 10,980,142 B2
(45) Date of Patent: Apr. 13, 2021

(54) ENCLOSURE WITH IMPROVED LOCKING OF A LID IN A SEALED POSITION

(71) Applicant: Telefonaktiebolaget LM Ericsson (publ), Stockholm (SE)

(72) Inventor: Martin Dermark, Töllsjö (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/966,559

(22) PCT Filed: Feb. 9, 2018

(86) PCT No.: PCT/EP2018/053290
§ 371 (c)(1),
(2) Date: Jul. 31, 2020

(87) PCT Pub. No.: WO2019/154508
PCT Pub. Date: Aug. 15, 2019

(65) Prior Publication Data
US 2020/0359517 A1  Nov. 12, 2020

(51) Int. Cl.
*H05K 5/06* (2006.01)
*H05K 9/00* (2006.01)
*H05K 5/04* (2006.01)
*H05K 5/00* (2006.01)

(52) U.S. Cl.
CPC ........... *H05K 5/061* (2013.01); *H05K 5/0008* (2013.01); *H05K 5/04* (2013.01); *H05K 9/006* (2013.01); *H05K 9/0015* (2013.01)

(58) Field of Classification Search
CPC . H05K 5/0008; H05K 9/0015; B65D 11/1873
See application file for complete search history.

(56) References Cited

U.S. PATENT DOCUMENTS

| 3,450,293 A | 6/1969 | Seda et al. |
| 4,711,361 A | 12/1987 | Mischenko |
| 5,382,753 A | 1/1995 | Farley |
| 5,395,002 A * | 3/1995 | Adler ..................... B65D 19/18 220/4.28 |
| 5,476,699 A * | 12/1995 | Hurvitz .................... H02B 1/26 220/4.31 |

(Continued)

OTHER PUBLICATIONS

International Search Report and Written Opinion dated Oct. 23, 2018 for International Application No. PCT/EP2018/053290 filed on Feb. 9, 2018, consisting of 10-pages.

*Primary Examiner* — Hung V Ngo
(74) *Attorney, Agent, or Firm* — Christopher & Weisberg. P.A.

(57) ABSTRACT

The present disclosure relates to an enclosure comprising a body, a lid, a locking member, and a resilient element arranged between the body and the lid. The resilient member is arranged to exert a resistive force on the lid when pressed between the body and the lid to seal the enclosure in a sealed position. The body includes at least a first recess and the lid includes at least a second recess, where each pair of a first recess and second recess is arranged to align in the sealed position, and to form a corresponding channel when aligned against the resistive force such that the enclosure is in the sealed position, and to then receive a corresponding locking member in the channel.

14 Claims, 9 Drawing Sheets

(56) References Cited

U.S. PATENT DOCUMENTS 8,210,379 B2 * 7/2012 Afflerbach ......... B65D 11/1873
   220/4.31
9,125,291 B2 * 9/2015 Lohman ............... H05K 9/0016

* cited by examiner

ENCLOSURE WITH IMPROVED LOCKING OF A LID IN A SEALED POSITION

CROSS-REFERENCE TO RELATED APPLICATION

This application is a Submission Under 35 U.S.C. § 371 for U.S. National Stage Patent Application of International Application Number: PCT/EP2018/053290 filed Feb. 9, 2018 entitled "AN ENCLOSURE WITH IMPROVED LOCKING OF A LID IN A SEALED POSITION," the entirety of which is incorporated herein by reference.

TECHNICAL FIELD

The present disclosure relates to an enclosure comprising a body, a lid, a locking member, and a resilient element arranged between the body and the lid. The resilient member is arranged to exert a resistive force on the lid when pressed between the body and the lid to seal the enclosure in a sealed position.

BACKGROUND

Today a mechanical enclosure that should contain electronic equipment is often made in two halves. To withstand mechanical requirements such as IP class, mechanical stress etc., these two halves are put together by using screws and some kind of weather sealing. To be sure that the mechanical requirements are fulfilled, the amount of screws is usually relatively large. The amount of screws will of course affect production time, and also increase the risk of loss of yield. There is also a risk of that one screw misses its thread and gets damaged. If that happens, that enclosure needs to be disassembled and go to repair, where this risk increases with the amount of screws. Furthermore, an enclosure that is put together with screws can be disassembled by unauthorized persons.

In cases where electromagnetically sensitive equipment is placed side an enclosure, the enclosure will require a separate EMC (Electromagnetic compliance) shielding as well. An enclosure that is assembled with screws in a conventional way will not be EMC sealed; radiated emissions will be able to reach in or out of the enclosure. To ensure EMC sealing, an EMC gasket is needed, which will add cost.

PIM (passive intermodulation) is a problem that can accrue in metal to metal connections due to non-linear behavior in these connections. When mechanical units are affected by radiation from, for example a nearby antenna, intermodulation that will affect performance can be generated. The more metal to metal irregularities, the harder it is to predict the result. Each screw can be a source for PIM.

In view of the above, is desirable to provide an enclosure with improved locking of a lid in a sealed position. Advantageously, the locking should enable an effective EMC shielding as well as PIM reduction.

SUMMARY

It is an object of the present disclosure to provide an enclosure with improved locking of a lid in a sealed position.

Said object is obtained by means of an enclosure comprising a body, a lid, a locking member, and a resilient element arranged between the body and the lid. The resilient member is arranged to exert a resistive force on the lid when pressed between the body and the lid to seal the enclosure in a sealed position. The body comprises at least a first recess and the lid comprises at least a second recess, where each pair of a first recess and second recess is arranged to align in the sealed position, and to form a corresponding channel when aligned against the resistive force such that the enclosure is in the sealed position, and to then receive a corresponding locking member in the channel. Each locking member is arranged to prevent the lid from moving in a direction of the resistive force when received in the corresponding channel, thereby locking the enclosure in the sealed position.

This confers an advantage of providing an enclosure with a reliable locking of a lid in a sealed position using relatively few components. This increases production yield, reduces production time and makes disassemble of the enclosure easier.

According to some aspects, the locking member is a locking rod having a circular cross-section, where each first recess and second recess has a corresponding half-circle cross-section shape, such that each channel has a circular cross-section when the corresponding recesses are aligned. Alternatively, the locking member is a locking rod having a rectangular cross-section, where each first recess and second recess has a corresponding rectangular cross-section shape, such that each channel has a rectangular cross-section when the corresponding recesses are aligned.

This confers an advantage of enabling a secure fit between a locking rod and corresponding channel.

According to some aspects, the body comprises a plurality of first recesses and the lid comprises a corresponding plurality of respective second recesses. Each first recess and second recess are pair-wise arranged to align and to receive a locking member when in the sealed position. The locking members are arranged to electromagnetically seal the enclosure when in the sealed position.

This confers an advantage of providing an enclosure with a reliable locking of a lid in a sealed position using relatively few components.

According to some aspects, the enclosure comprises a hinge structure arranged between the body and the lid. The first recess and second recess are arranged on an opposite side of the body from the hinge structure.

This confers an advantage of providing an enclosure with a reliable locking of a lid in a sealed position using only one locking member.

According to some aspects, the body, lid, and at least one locking member are electrically conducting, where each locking member is arranged in electrical contact with the body and with the lid when received in the corresponding first recess and second recess.

This confers an advantage of providing an enclosure with a reliable locking of a lid in an sealed position that is electromagnetically shielded using relatively few components. Furthermore, possible generation of passive intermodulation (PIM) is reduced since the number of metal to metal connection points is reduced to a relatively well-controlled connection. The metal to metal connections that exist are more hidden than the conventional methods using screws. This will also work favor for reducing PIM.

There are also disclosed herein methods associated with the above-mentioned advantages.

Other examples are provided in the dependent claims.

BRIEF DESCRIPTION OF THE DRAWINGS

The present disclosure will now be described more in detail with reference to the appended drawings, where.

DETAILED DESCRIPTION

Figure 1:
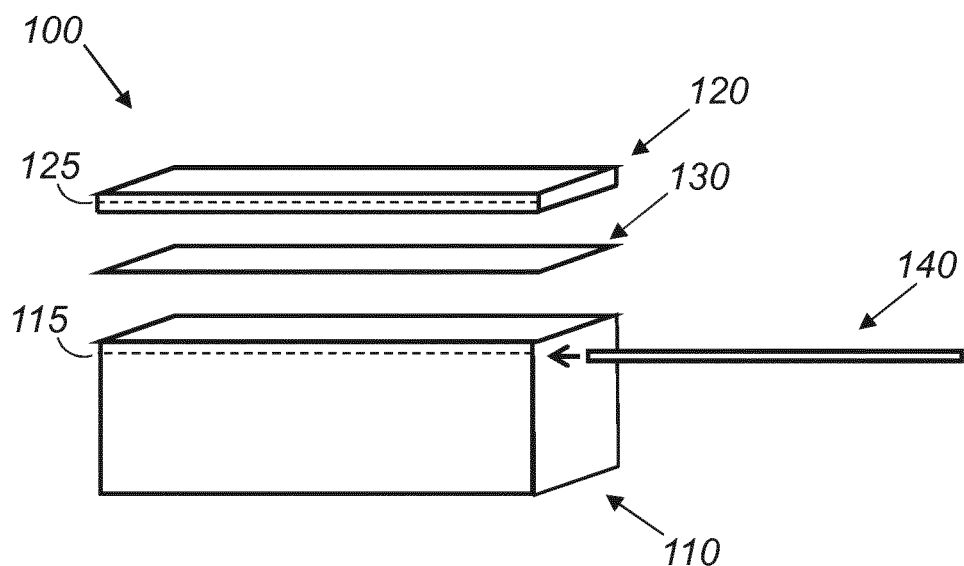
FIG. 1 schematically shows an enclosure according to the present disclosure.

With reference to FIG. 1, there is an enclosure 100 comprising a body 110, a lid 120, and a resilient element 130 arranged between the body and the lid. The resilient member 130 is arranged to exert a resistive force F on the lid when pressed between the body and the lid to seal the enclosure 100 in a sealed position. The body 110 comprises a first recess 115 and the lid comprises a second recess 125, where said recesses form a pair.

Figures 2A, 2B, 2C:
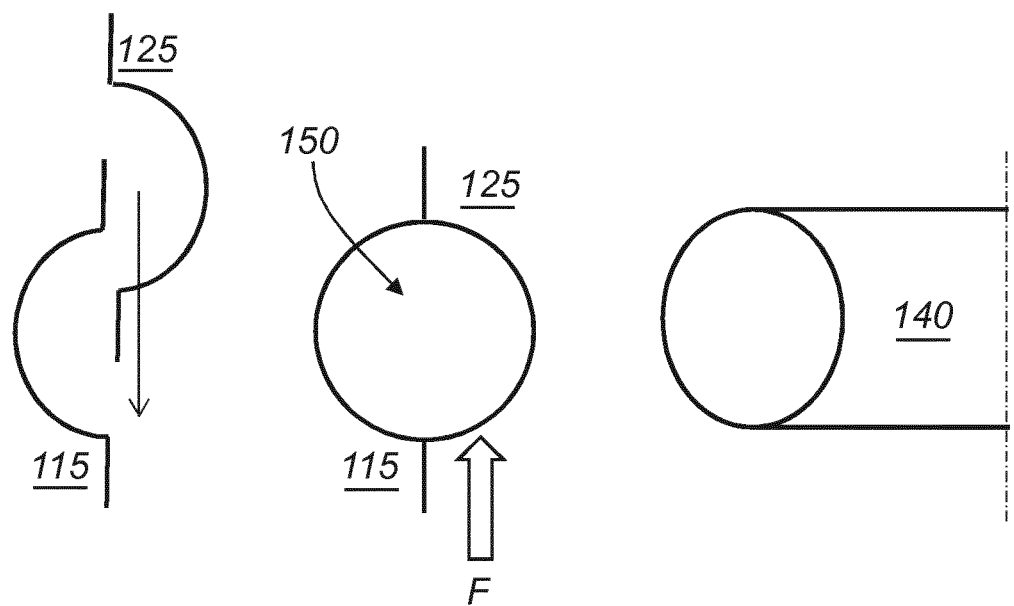
FIG. 2A schematically shows a first recess and a second recess before alignment for forming a circular channel.
FIG. 2B schematically shows a first recess and a second recess after alignment for forming a circular channel.
FIG. 2C schematically shows a circular locking member.

According to the present disclosure, with reference also to FIG. 2A, FIG. 2B and FIG. 2C, the pair of recesses 115, 125 is arranged to align in the sealed position, and to form a corresponding channel 150 when aligned against the resistive force F when the enclosure is in the sealed position. Then the formed channel 150 is adapted to receive a locking rod 140 that has a circular cross-section, where the first recess 115 and the second recess 125 have corresponding half-circle cross-section shapes such that the channel 150 has a circular cross-section that is adapted to receive the locking rod 140. The locking rod 140 is comprised in the enclosure 100 and is arranged to prevent the lid 120 from moving in a direction of the resistive force F when received in the channel, thereby locking the enclosure 100 in the sealed position.

Figure 3A:
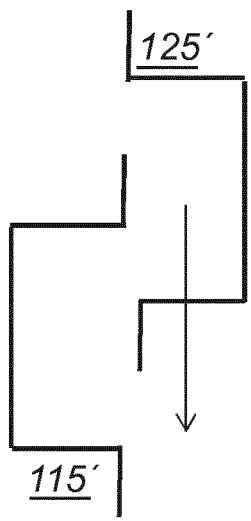
FIG. 3A schematically shows a first recess and a second recess before alignment for forming a rectangular channel.
Figure 3B:
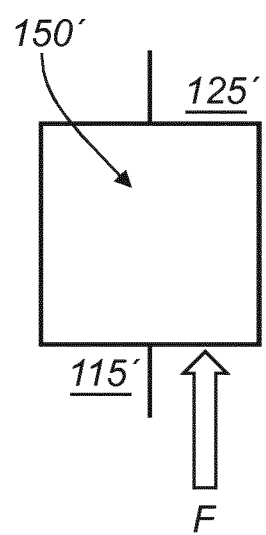
FIG. 3B schematically shows a first recess and a second recess after alignment for forming a rectangular channel.
Figure 3C:
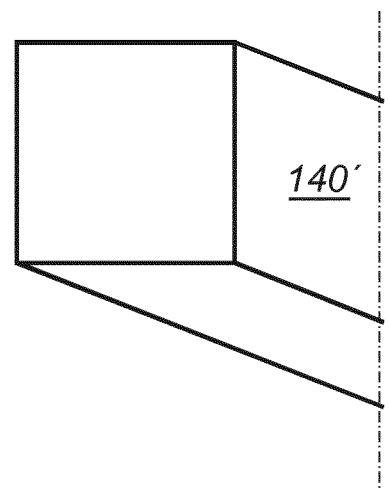
FIG. 3C schematically shows a rectangular locking member.

As shown in FIG. 3A, FIG. 3B and FIG. 3C there is a locking rod 140' that has a rectangular cross-section, where there furthermore is a first recess 115' and a second recess 125' that have corresponding rectangular cross-section shapes. In this way a channel 150' is formed that has a circular cross-section and is adapted to receive the locking rod 140'.

A more detailed example will now be presented.

Figures 4A, 4B:
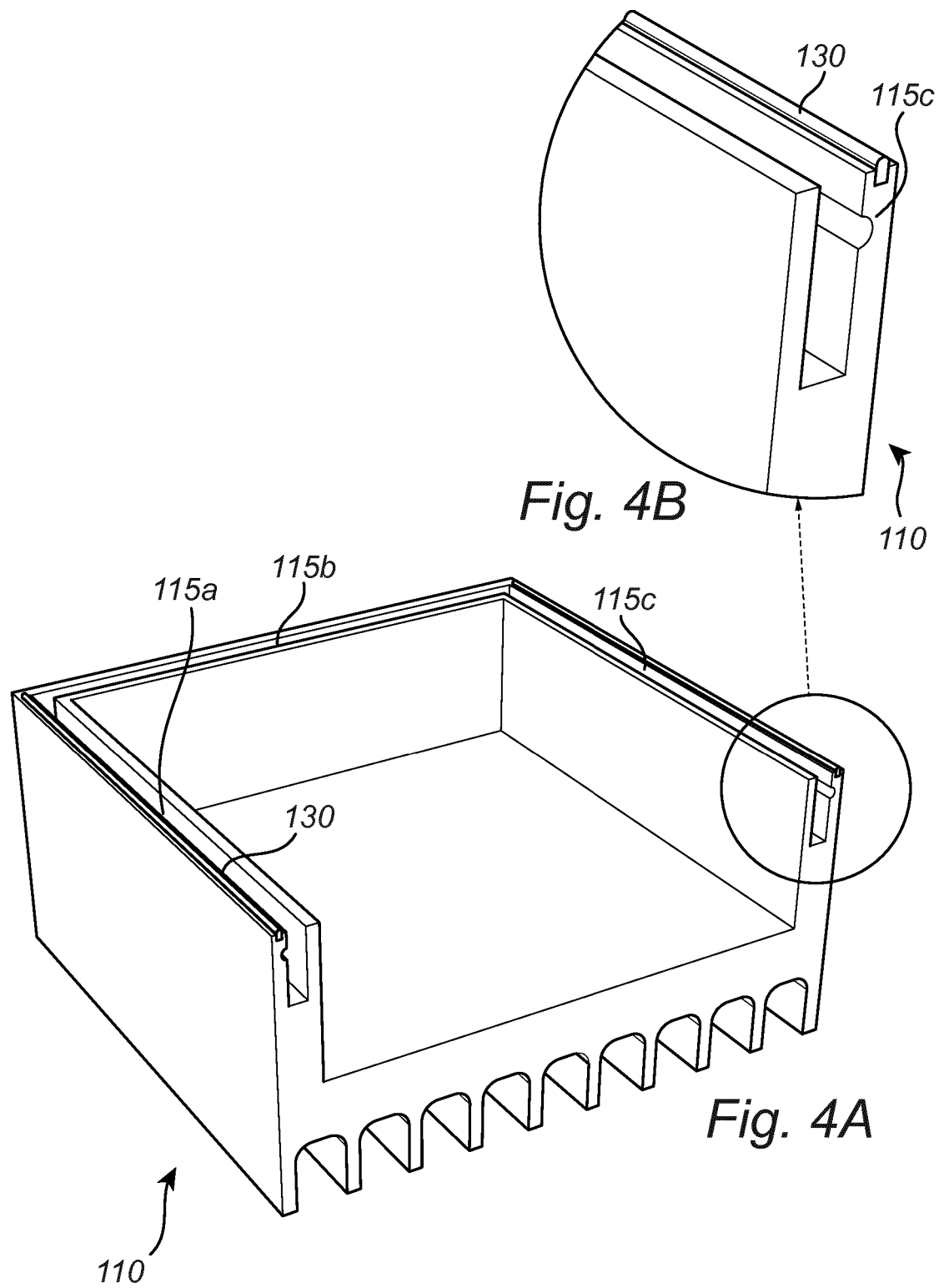
FIG. 4A schematically shows a perspective cross-section view of the body.
FIG. 4B schematically shows an enlarged detail of FIG. 4A.
Figure 5:
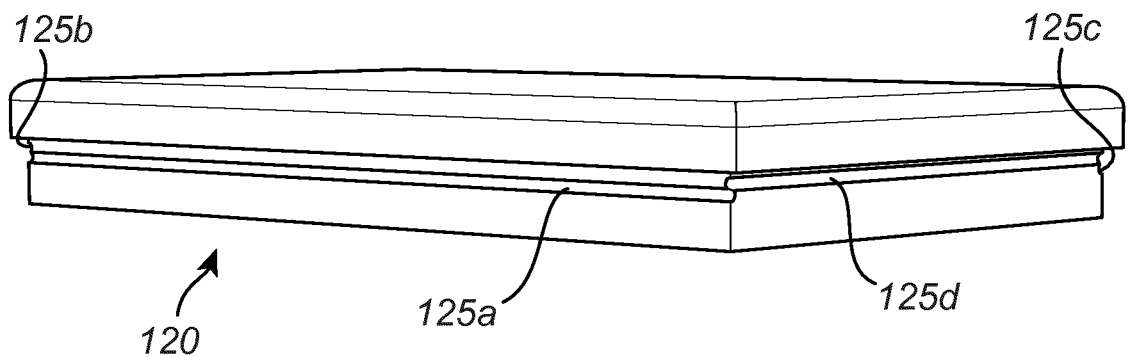
FIG. 5 schematically shows a perspective view of a lid.

FIG. 4A that shows a sectional view of the body 110, FIG. 4B that sows a detail of FIG. 4A and FIG. 5 that shows the lid 120, the body 110 comprises a plurality of first recesses 115a, 115b, 115c and the lid 120 comprises a corresponding plurality of second recesses 125a, 125b, 125d. Due to the sectional view of the body 110, a first recess that is adapted to correspond to a short side second recess 125d is not shown. The resilient element 130 is shown as a circumferentially running elastic seal, such as a sealing gasket.

The first recesses 115a, 115b, 115c run around the sides of the body 110 where recesses on adjacent sides 115a, 115b; 115b, 115c have different positions along the direction of the resistive force F. The half-circle shaped tracks of adjacent first recesses 115a, 115b; 115b, 115c have a position that differ at least one diameter of the half-circle.

Correspondingly, the second recesses 125a, 125b, 125c, 125d run around the sides of the lid 120 where recesses on adjacent sides 125a, 125b; 125b, 125c; 125c; 125d; 125d, 125a have different positions along the direction of the resistive force F when the lid 120 is mounted to the body 110. All recesses 115a, 115b, 115c; 125a, 125b, 125c, 125d are adapted to align pair-wise in the sealed position, and to form corresponding channels into which locking rods can be inserted.

Figure 7B:
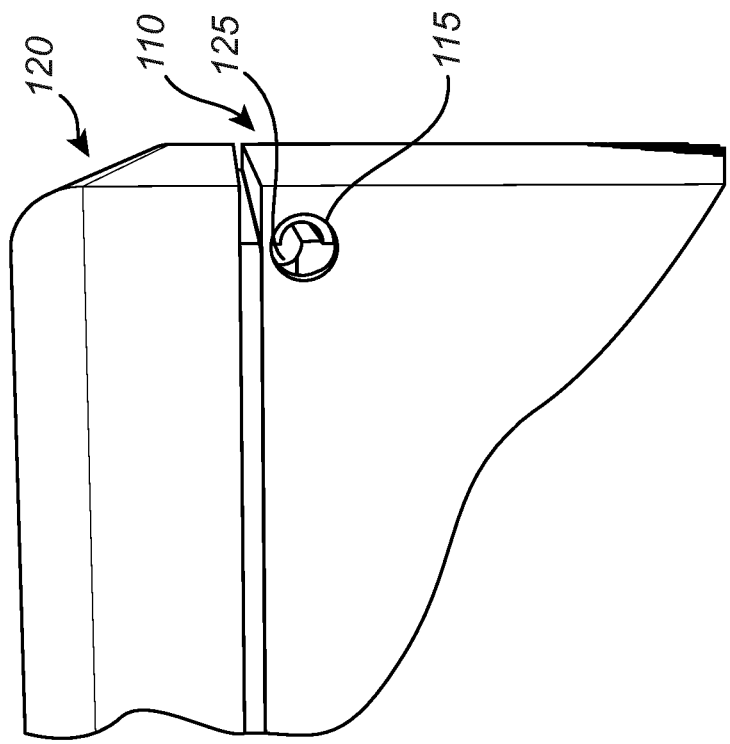
FIG. 7B schematically shows a first recess and a second recess before alignment for forming a circular channel, when the lid rests on a resilient member.
Figure 7A:
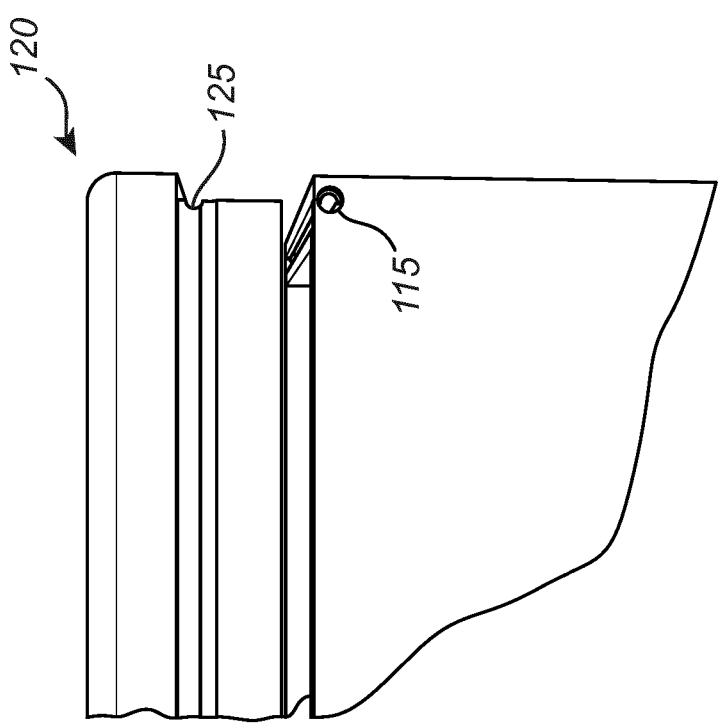
FIG. 7A schematically shows a first recess and a second recess before alignment for forming a circular channel, when the lid and the body are separated.
Figure 7C:
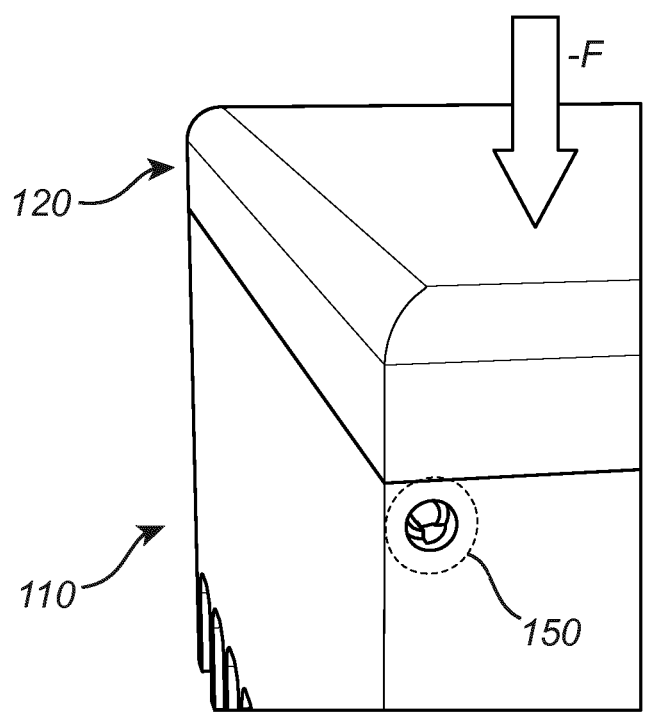
FIG. 7C schematically shows a first recess and a second recess after alignment for forming a rectangular channel.

In FIG. 7A, FIG. 7B and FIG. 7C it is shown how a channel 150 is formed when the lid 120 is pressed towards the body 110, against the resistive force F of the resilient member 130. In FIG. 7A, the lid 120 is approaching the body 110 and in FIG. 7B the lid 120 rests on the resilient element 130 which now starts to make resistance against further movement of the lid 120 against the body 110. To close the enclosure 100, a force –F that counteracts the resistive force F needs to be applied over the lid 110, compressing the resilient element 130 until the enclosure 100 is fully closed as shown in FIG. 7C. The two mating recesses 115, 125 form a complete cylindrical shape such that a cylindrical channel 150 is obtained.

Figure 8:
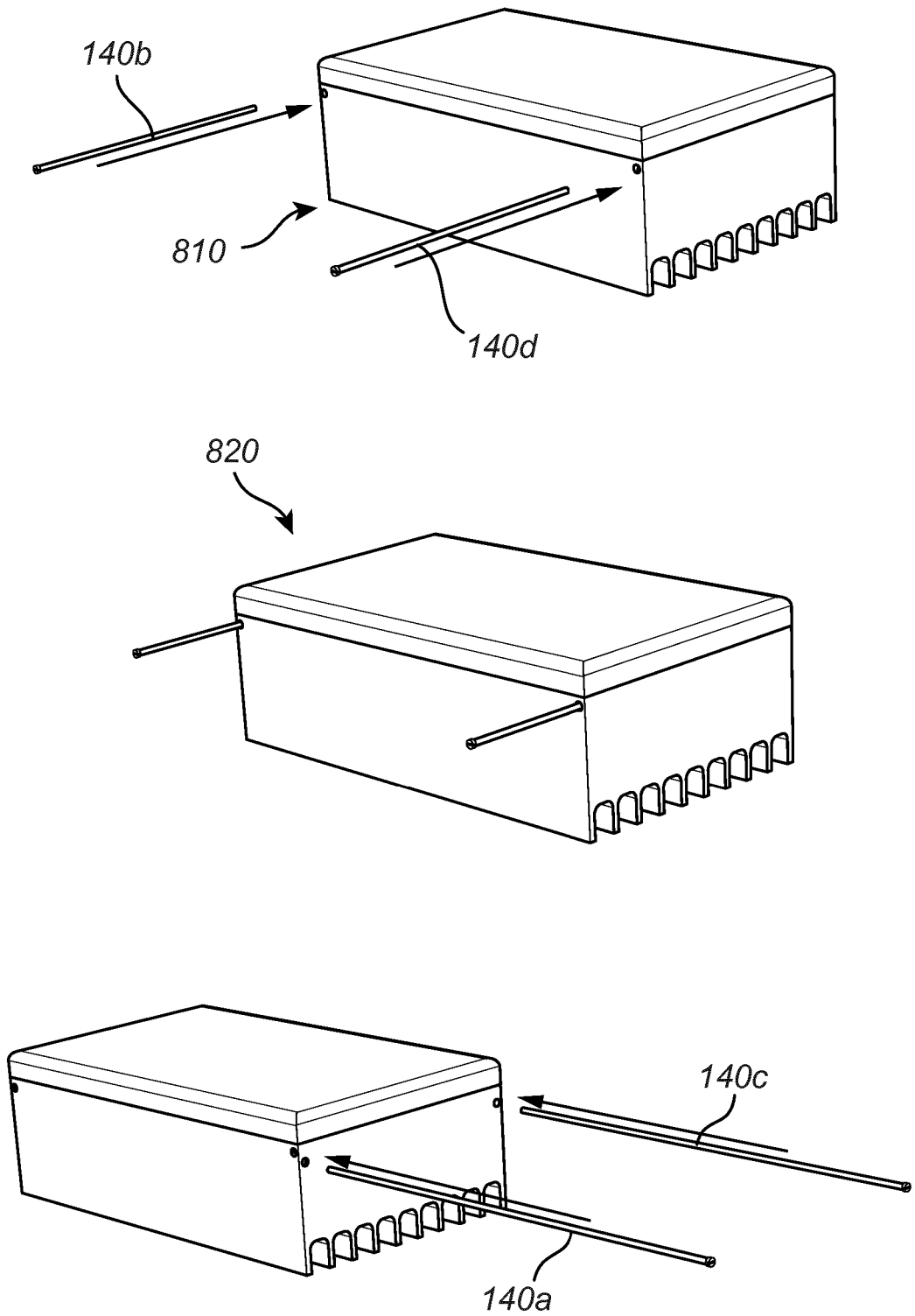
FIG. 8 schematically shows perspective views of insertion of locking members into the formed channels in the lid and the body.

With reference to FIG. 8, it is shown how corresponding locking rods 140a, 140b, 141c, 140d are inserted in the formed channels, two from one direction and two from a perpendicular direction. The force needs to be applied while all locking rods 140a, 140b, 141c, 140d are slid into position.

Figure 9:
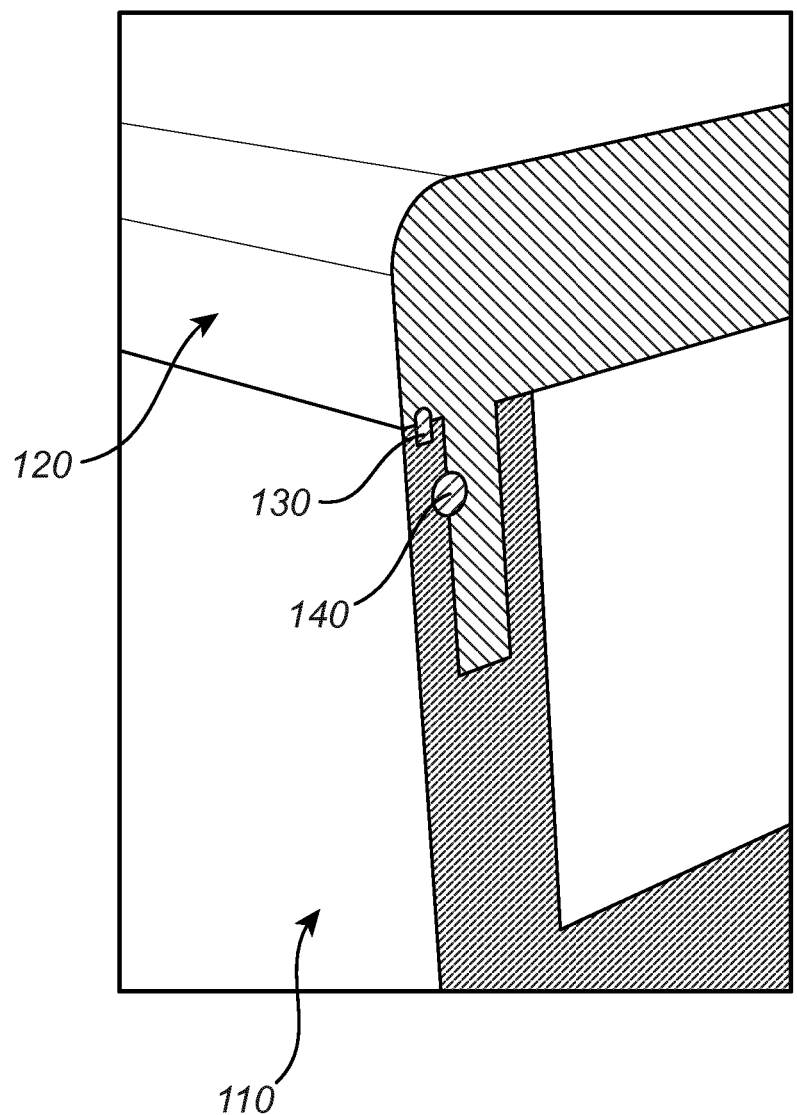
FIG. 9 schematically shows an enlarged detail perspective view of a locking member in position for locking the enclosure in a sealed position.

Once all four locking rods 140a, 140b, 141c, 140d are in place, the external force should be removed. When that happens, also with reference to FIG. 9, in theory the recesses in each pair of recesses that are held together by means of a corresponding locking rod wants to move away from each other by the resistive force F from the compressed resilient element 130, striving to separate the lid 120 from the body 110. But since the locking rods 140a, 140b, 141c, 140d have filled up the cylindrical channels, they will prevent the lid 120 and the body 110 to move away from each other. the resilient element 130 remains compressed and the resistive force F from the compressed resilient element 130 prevents the locking rods 140a, 140b, 141c, 140d from moving. Not only is the enclosure 100 now completely closed and locked, it is also weather sealed.

To completely lock the enclosure, 1-4 locking rods are required depending on the design, in the example above 4 locking rods 140a, 140b, 141c, 140d. To ensure an EMC shielding, 4 metallic locking rods should be used, and the body 110 and the lid should be made in an electrically conducting material, or at least plated with an electrically conducting material. The locking rods are then not only part of the locking mechanism, they also enable EMC sealing by making an electrical connection between the body 110 and the lid 120. In this way, the locking rods 140a, 140b, 141c, 140d are arranged to electromagnetically seal the enclosure 100 when in the sealed position. The enclosure 100 is then suited for electromagnetically shielding one or more electrical components, according to some aspects electromagnetically shielding one or more radio components, without using an extra EMC gasket. This means that all equipment inside the enclosure will be in an EMC safe environment and the risk of radiated emissions will be minimized just by using this enclosure.

By reducing the metal to metal connection points to one, or a few, controlled connections, generation of PIM is reduced. The metal to metal connections that exist are more hidden than when using for example screws, which also reduces the generation of PIM.

The previously mentioned difference in position of adjacent recesses enables all locking rods 140a, 140b, 141c, 140d to be inserted without interfering with each other, and without creating electrical gaps in the corners, enabling a proper EMC shielding.

The present disclosure is not limited to the example described above, but may vary within the scope of the appended claims. For example, the resilient element 130 has been showed to be fixedly attached to the body 110, but could as well be fixedly attached to the lid 120.

As mentioned above, for different designs, different numbers of formed channels and locking rods are required. For example, according to some aspects the enclosure 100 comprises a hinge structure arranged between the body 110 and the lid 120, where one first recess 115 and one second recess 125 are arranged on an opposite side of the body 120 from the hinge structure.

If EMC shielding is not of importance, the locking rods can be made in a non-conducting material such as a plastic material. This also further reduces PIM.

Figure 6:
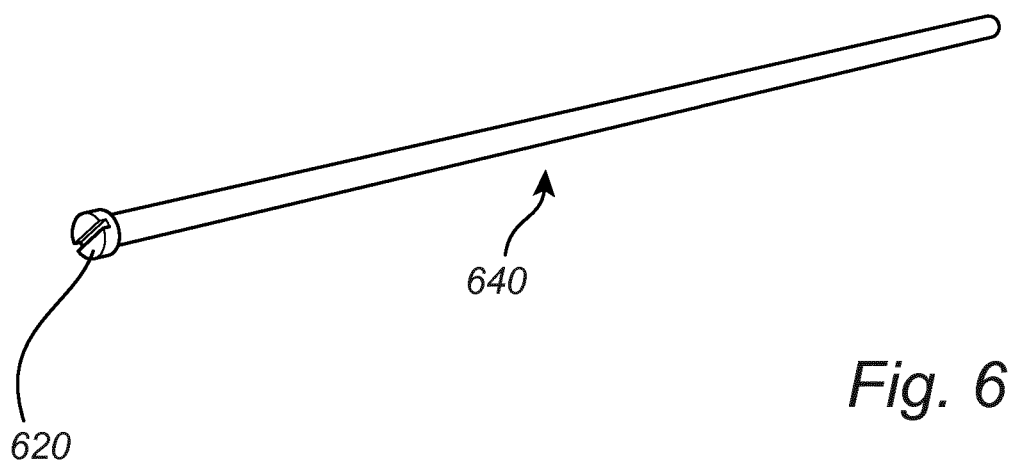
FIG. 6 schematically shows a perspective view of a locking member.

The locking rods are generally constituted by locking members. As shown in FIG. 6, a locking rod 140 is according to some aspects in the form of a metallic cylindrical member 640 with a screw-mount head portion 620. The locking rod 640 is according to some aspects only removable by means of a special tool. According to some aspects, each locking rod 640 comprises a threaded portion, for example at the end opposite the screw-mount head portion 620. These threads are adapted to engage corresponding threads formed in the channels, such that a certain screw-driving tool is used for attaching and de-attaching the locking rods 640.

Figure 10:
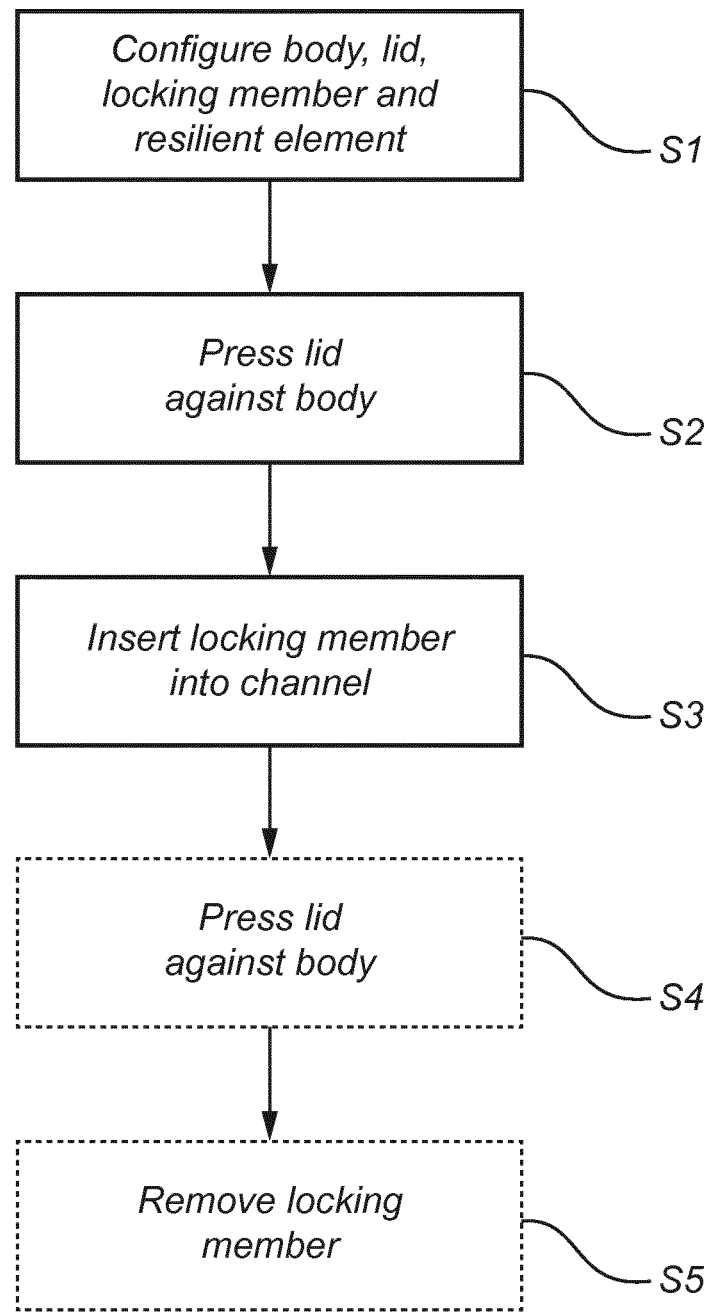
FIG. 10 shows a flowchart for methods according to the present disclosure.

With reference to FIG. 10, the present disclosure relates to a method of enclosing one or more components in an enclosure, comprising configuring S1 a body 110, a lid 120, a locking member 140, and a resilient element 130 arranged between the body and the lid, the resilient member 130 being arranged to exert a resistive force on the lid when pressed between the body and the lid to seal the enclosure in a sealed position, the body comprising a first recess 115, the lid comprising a second recess 125. The first recess 115 and the second recesses 125 are arranged to align in the sealed position, and to form a channel 150 when aligned, and to receive the locking member 140 in the channel 150, the locking member 140 being arranged to prevent the lid 120 from moving in a direction of the resistive force when received in the channel 150, thereby locking the enclosure 100 in the sealed position, pressing S2 the lid 120 against the body 110 to generate the resistive force, and inserting S3 the locking member 140 into the channel 150 to seal the enclosure 100.

According to some aspects, the method comprises pressing S4 the lid 120 against the body 120 to generate a further resistive force, and removing S5 the locking member 140 from the channel 150 to un-seal the enclosure 100.

By means of the present disclosure, production yield is increased, production time is reduced and disassembly of the enclosure is facilitated.

Generally, the present disclosure relates to an enclosure 100 comprising a body 110, a lid 120, a locking member 140, and a resilient element 130 arranged between the body 110 and the lid 120, the resilient member 130 being arranged to exert a resistive force F on the lid 120 when pressed between the body 110 and the lid 110 to seal the enclosure 100 in a sealed position, the body 110 comprising at least a first recess 115, the lid 120 comprising at least a second recess 125, each pair of a first recess 115 and second recess 125 being arranged to align in the sealed position, and to form a corresponding channel 150 when aligned against the resistive force F such that the enclosure 100 is in the sealed position, and to then receive a corresponding locking member 140 in the channel 150, each locking member 140 being arranged to prevent the lid 120 from moving in a direction of the resistive force F when received in the corresponding channel 150, thereby locking the enclosure 100 in the sealed position.

According to some aspects, the locking member 140 is a locking rod 640 having a circular cross-section, wherein each first recess 115 and second recess 125 has a corresponding half-circle cross-section shape, such that each channel 150 has a circular cross-section when the corresponding recesses 115, 125 are aligned.

According to some aspects, the locking member 140' has a rectangular cross-section, and wherein each first recess 115' and second recess 125' has a corresponding rectangular cross-section shape, such that each channel 150' has a rectangular cross-section when the corresponding recesses 115', 125' are aligned.

According to some aspects, the body 110 comprises a plurality of first recesses 115a, 115b, 115c, 115d, and wherein the lid 120 comprises a corresponding plurality of respective second recesses 125a, 125b, 125c, 125d, each first recess 115a, 115b, 115c, 115d and second recess 125a, 125b, 125c, 125d being arranged to align and to receive a locking member 140a, 140b, 140c, 140d when in the sealed position, wherein the locking members 140a, 140b, 140c, 140d being arranged to electromagnetically seal the enclosure 100 when in the sealed position.

According to some aspects, the enclosure comprises a hinge structure arranged between the body 110 and the lid 120, wherein the first recess 115 and second recess 125 are arranged on an opposite side of the body 110 from the hinge structure.

According to some aspects, the body 110, lid 120, and at least one locking member 140 are electrically conducting, where each locking member 140 is arranged in electrical contact with the body 110 and with the lid 120 when received in the corresponding first recess 115 and second recess 125.

According to some aspects, the enclosure 100 is an enclosure for enclosing and electromagnetically shielding one or more electrical components.

According to some aspects, wherein the enclosure 100 is an enclosure for enclosing and electromagnetically shielding one or more radio components.

According to some aspects, the resilient element 130 is an elastic seal.

According to some aspects, the resilient element 130 is arranged fixedly attached to the body 110.

According to some aspects, the resilient element 130 is arranged fixedly attached to the lid 120.

The invention claimed is:

1. An enclosure comprising:
    a body having a plurality of first recesses;
    a lid having a plurality of second recesses;
    four locking members;
    a resilient element arranged between the body and the lid, the resilient member being arranged to exert a resistive force on the lid when pressed between the body and the lid to seal the enclosure in a sealed position;
    each pair of a first recess and second recess being arranged to align in the sealed position, and to form a corresponding channel when aligned against the resistive force such that the enclosure is in the sealed position, and to then receive a corresponding locking member in the channel;
    each locking member being arranged to prevent the lid from moving in a direction of the resistive force when received in the corresponding channel, thereby locking the enclosure in the sealed position, and the locking members being electromagnetically sealing the enclosure when in the sealed position; and
    the body, lid, and the locking members are electrically conducting, where each locking member is in electrical contact with the body and with the lid when received in the corresponding first recess and second recess.

2. The enclosure according to claim 1, wherein the locking member is a locking rod having a circular cross-section, wherein each first recess and second recess has a corresponding half-circle cross-section shape, such that each channel has a circular cross-section when the corresponding recesses are aligned.

3. The enclosure according to claim 2, wherein the enclosure is an enclosure for enclosing and electromagnetically shielding one or more electrical components.

4. The enclosure according to claim 2, wherein the enclosure is an enclosure for enclosing and electromagnetically shielding one or more radio components.

5. The enclosure according to claim 2, wherein the resilient element is an elastic seal.

6. The enclosure according to claim 2, wherein the resilient element is fixedly attached to the body.

7. The enclosure according to claim 1, wherein the locking member has a rectangular cross-section, and wherein each first recess and second recess has a corresponding rectangular cross-section shape, such that each channel has a rectangular cross-section when the corresponding recesses are aligned.

8. The enclosure according to claim 1, wherein the enclosure is an enclosure for enclosing and electromagnetically shielding one or more electrical components.

9. The enclosure according to claim 1, wherein the enclosure is an enclosure for enclosing and electromagnetically shielding one or more radio components.

10. The enclosure according to claim 1, wherein the resilient element is an elastic seal.

11. The enclosure according to claim 1, wherein the resilient element is fixedly attached to the body.

12. The enclosure according to claim 1, wherein the resilient element is arranged fixedly attached to the lid.

13. A method of enclosing one or more components in an enclosure, the method comprising:
    configuring a body, a lid, four locking members, and a resilient element arranged between the body and the lid, the resilient member being arranged to exert a resistive force on the lid when pressed between the body and the lid to seal the enclosure in a sealed position, the body comprising a plurality of first recesses, the lid comprising a plurality of second recesses, each pair of the first recesses and second recesses being arranged to align in the sealed position, and to form a channel when aligned, and to receive a locking member in the channel, the locking member being arranged to prevent the lid from moving in a direction of the resistive force when received in the channel, thereby locking the enclosure in the sealed position, and the locking members being arranged to electromagnetically seal the enclosure when in the sealed position, the body, lid, and the locking members are electrically conducting, where each locking member is in electrical contact with the body and with the lid when received in the corresponding first recess and second recess;
    pressing the lid against the body to generate the resistive force; and
    inserting the locking member into the channel to seal the enclosure.

14. The method according to claim 13, further comprising pressing the lid against the body to generate a further resistive force, and removing the locking member from the channel to un-seal the enclosure.

* * * * *